United States Patent
Fushimi et al.

(10) Patent No.: US 11,240,940 B2
(45) Date of Patent: Feb. 1, 2022

(54) HEAT RADIATION STRUCTURE OF ELECTRIC PARTS ASSEMBLY, HEAT CONDUCTION SHEET, AND METHOD OF MANUFACTURING ELECTRIC PARTS ASSEMBLY

(71) Applicant: HONDA MOTOR CO., LTD., Tokyo (JP)

(72) Inventors: Takaaki Fushimi, Wako (JP); Ryota Kitamoto, Wako (JP); Jun Kato, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/022,134

(22) Filed: Sep. 16, 2020

(65) Prior Publication Data

US 2021/0092881 A1    Mar. 25, 2021

(30) Foreign Application Priority Data

Sep. 25, 2019   (JP) .............................. JP2019-174201

(51) Int. Cl.
| | | |
|---|---|---|
| *H05K 7/20* | (2006.01) | |
| *H01L 23/367* | (2006.01) | |
| *B60L 50/60* | (2019.01) | |

(52) U.S. Cl.
CPC ....... *H05K 7/20854* (2013.01); *H01L 23/367* (2013.01); *H05K 7/2039* (2013.01);
(Continued)

(58) Field of Classification Search
CPC .... H05K 3/323; H05K 7/2039; H05K 1/0203; H05K 7/20481; H05K 7/20472;
(Continued)

(56) References Cited

U.S. PATENT DOCUMENTS

| | | | | |
|---|---|---|---|---|
| 7,709,951 B2 * | 5/2010 | Brodsky | ............... | H01L 23/433 257/713 |
| 8,338,946 B2 * | 12/2012 | Yanase | .................... | H01L 24/11 257/737 |

(Continued)

FOREIGN PATENT DOCUMENTS

| | | |
|---|---|---|
| JP | 2005-245149 | 9/2005 |
| JP | 2012-054513 | 3/2012 |

*Primary Examiner* — Adam B Dravininkas
(74) *Attorney, Agent, or Firm* — Amin, Turocy & Watson, LLP

(57) ABSTRACT

A heat radiation structure of an electric parts assembly, a heat conduction sheet, and a method of manufacturing an electric parts assembly are provided that are capable of reducing a gap between neighboring separate sheets after sheet compression while minimizing an unintentional increase in sheet reaction force. A heat conduction sheet (101A) disposed between a cooler and a heat generating element includes a plurality of separate sheets (102), each of the separate sheets (102) includes a plurality of convex sections protruding circumferentially outward from the sheet and a plurality of concave section recessed circumferentially inward on an outer circumferential edge of a shape when seen in a plan view in a state before being pinched between a cooler and a heat generating element, and the convex sections and the concave sections are disposed to be arranged alternately in a circumferential direction of the separate sheets (102) in a shape when seen in a plan view. When the plurality of separate sheets (102) are pinched between the cooler and the heat generating element, the gap between the neighboring separate sheets (102) is reduced by changing a shape of the outer circumferential edge of the plurality of separate sheets (102) to fill the neighboring concave sections.

7 Claims, 8 Drawing Sheets

(52) U.S. Cl.
CPC .......... *H05K 7/20472* (2013.01); *B60L 50/60* (2019.02); *B60L 2210/10* (2013.01)

(58) Field of Classification Search
CPC ........... H05K 7/20463; H05K 7/20454; H05K 1/0204; H05K 1/0201; H05K 7/20445; H05K 7/2049
See application file for complete search history.

(56) References Cited

U.S. PATENT DOCUMENTS

| | | | | |
|---|---|---|---|---|
| 2005/0061474 | A1* | 3/2005 | Gelorme | H01L 23/433 165/80.2 |
| 2007/0127211 | A1* | 6/2007 | Macris | H01L 23/433 361/700 |
| 2008/0073775 | A1* | 3/2008 | Brunschwiler | H01L 23/433 257/704 |
| 2009/0039503 | A1* | 2/2009 | Tokita | H01L 23/433 257/717 |
| 2014/0370340 | A1* | 12/2014 | Kimura | H01M 10/6561 429/72 |
| 2015/0282380 | A1* | 10/2015 | De Bock | H01L 23/42 361/704 |
| 2016/0004284 | A1* | 1/2016 | Cohen | G06F 1/20 361/679.54 |
| 2017/0374759 | A1* | 12/2017 | Hoffmeyer | H01L 23/373 |
| 2019/0281726 | A1* | 9/2019 | Puglisi | B32B 27/20 |

* cited by examiner

HEAT RADIATION STRUCTURE OF ELECTRIC PARTS ASSEMBLY, HEAT CONDUCTION SHEET, AND METHOD OF MANUFACTURING ELECTRIC PARTS ASSEMBLY

CROSS-REFERENCE TO RELATED APPLICATION

Priority is claimed on Japanese Patent Application No. 2019-174201, filed Sep. 25, 2019, the content of which is incorporated herein by reference.

BACKGROUND OF THE INVENTION

Field of the Invention

The present invention relates to a heat radiation structure of an electric parts assembly, a heat conduction sheet, and a method of manufacturing an electric parts assembly.

Description of Related Art

In the related art, in an electric conversion device or the like used in an electric automobile, a technology related to a heat radiation of a heat generating element such as a capacitor element or a semiconductor element is known. For example, Patent Literature 1 (Japanese Unexamined Patent Application, First Publication No. 2005-245149) discloses a configuration in which a highly heat conductive sheet is provided between a heat generating element and a support body, and a highly heat conductive member such as a heat pipe or the like is provided on a back surface of the support body. For example, Patent Literature 2 (Japanese Unexamined Patent Application, First Publication No. 2012-054513) discloses a configuration including a heat radiation plate having the stress attenuating part and a semiconductor element in which a pair of bus bars are adhered at a position where a stress attenuating part is sandwiched via resin sheets and is adhered to and sandwiched between the pair of bus bars.

SUMMARY OF THE INVENTION

Incidentally, while a gap on the basis of component tolerances is required between a heat generating element and a cooler, since heat conductivity of air is low, an inclusion configured to fill the gap is needed. As an inclusion, a heat radiation sheet (a heat conduction sheet) which is soft and able to conform to a shape may be used. When the heat conduction sheet is pinched and compressed between the heat generating element and the cooler, in order to reduce a sheet reaction force at this time, it is conceivable to separate the heat conduction sheet into a plurality of sheets.

However, when a plurality of separate sheets are used, it is desired that a gap between neighboring separate sheets after sheet compression be reduced as much as possible. That is, when the size of the gap between separate sheets is increased, a compression area of the entire heat conduction sheet is reduced, and thus, the heat radiation performance is affected. In addition, when the separate sheets interfere with each other upon sheet compression, the sheet reaction force may be increased unintentionally and the electric equipment case may be damaged. Since a heat conduction sheet does not simply form a similar shape before and after compression, it is desired to research a device that assumes the same shape after compression.

Here, the present invention is directed to providing a heat radiation structure of an electric parts assembly, a heat conduction sheet, and a method of manufacturing an electric parts assembly that is capable of reducing a gap between neighboring separate sheets after sheet compression while minimizing an unintentional increase in sheet reaction force.

a heat radiation structure of an electric parts assembly, a heat conduction sheet, and a method of manufacturing an electric parts assembly according to the present invention employ the following configurations.

(1) A heat radiation structure of an electric parts assembly (35K) according to an aspect of the present invention is a heat radiation structure of an electric parts assembly including a cooler (88); a heat generating element (35) disposed on a mounting surface (88A) of the cooler (88); and a heat conduction sheet (101) disposed between a facing surface (35A) of the heat generating element (35) on the side of the cooler (88) and a mounting surface (88A) of the cooler (88), and assembled in a state in which the heat conduction sheet (101) is pinched between the heat generating element (35) and the cooler (88). The heat conduction sheet (101) includes a plurality of separate sheets (102) separated from each other when seen in a plan view. Each of the separate sheets (102) includes a plurality of convex sections (104) protruding circumferentially outward from the sheet and a plurality of concave sections (103) recessed circumferentially inward on an outer circumferential edge of a shape when seen in a plan view in a state before being pinched between the heat generating element (35) and the cooler (88). The convex sections (104) and the concave sections (103) are disposed to be arranged alternately in a circumferential direction of the separate sheets (102) in a shape when seen in a plan view.

According to the aspect of (1), when the heat generating element and the cooler are pressure-welded through fastening or the like, the plurality of separate sheets are pinched between the heat generating element and the cooler and crushed. Here, the separate sheets are deformed to radially expand from the central position in a shape when seen in a plan view. For this reason, in a state in which the heat generating element and the cooler are assembled to compress the separate sheets, the separate sheets fill the concave sections of the outer circumferential edge, changing them into a substantially polygonal shape. An unintentional increase in sheet reaction force can be minimized by disposing the plurality of separate sheets in anticipation of this shape change. In addition, a gap between neighboring separate sheets after sheet compression can be reduced to increase the heat radiation performance of the heat generating element.

(2) In the heat radiation structure of an electric parts assembly according to the aspect of (1), the heat generating element (35) may include a plurality of heat generating elements (35b) arranged in a direction along a surface along the facing surface (35A), and the plurality of separate sheets (102) may be disposed to overlap the plurality of heat generating elements (35b) when seen in a plan view.

According to the aspect of (2), the separate sheets can be disposed in the immediate vicinity of the heat generating element that is a heat source, and heat of the heat generating element is efficiently radiated to the cooler through the separate sheets. Accordingly, heat radiation performance of the heat generating element can be increased.

(3) In the heat radiation structure of an electric parts assembly according to the aspect of (2), the heat generating elements (35b) may be capacitor elements, and a second heat generating element (37) including a semiconductor element may be disposed on a second mounting surface (88B) of the cooler (88) opposite to the mounting surface (88A).

According to the aspect of (3), since the semiconductor element is disposed at a side of the cooler opposite to the capacitor element, heat radiation of the semiconductor element can be performed by the cooler while minimizing an influence of the heat of the capacitor element with respect to the semiconductor element.

(4) In the heat radiation structure of an electric parts assembly according to the aspect of any one of (1) to (3), the concave section (103) may be formed to approach a central position (P1) in a shape when seen in a plan view as it approaches a central position (P2) of the concave section (103) in the circumferential direction.

According to the aspect of (4), since the central position of the concave section in the circumferential direction is closest to the central position of the separate sheets of the shape when seen in a plan view, a deformation margin upon pinching of the separate sheets is easily secured. That is, when the separate sheets are deformed to radially expand from the central position in a shape when seen in a plan view, a margin for the concave sections extending circumferentially outward from the sheet outer side is easily secured. For this reason, the separate sheets can be sufficiently pressed to bring the heat generating element and the cooler into close contact with each other.

(5) In the heat radiation structure of an electric parts assembly according to the aspect of any one of (1) to (4), the outer circumferential edge of the separate sheets (102) in a shape when seen in a plan view may be formed by arranging alternately the four convex sections (104) and the four concave sections (103), and when virtual lines (103a) are drawn to close a sheet outer circumferential side of the concave sections (103) and the four virtual lines (103a) corresponding to the four concave sections (103) are connected to each other, a rectangular shape when seen in a plan view may be formed.

According to the aspect of (5), when the separate sheets are pinched between the heat generating element and the cooler and deformed, the concave section of the outer circumferential edge is changed into a linear shape, and the separate sheets are changed into a substantially rectangular shape. Accordingly, when the separate sheets are pinched and deformed, it is possible to easily form a state in which the plurality of separate sheets are spread between the heat generating element and the cooler.

(6) A heat conduction sheet (102) according to an aspect of the present invention is a heat conduction sheet disposed between a cooler (88) and a heat generating element (35) and pinched between the heat generating element (35) and the cooler (88), including a plurality of convex sections (104) protruding circumferentially outward from the sheet and a plurality of concave sections (103) recessed circumferentially inward on an outer circumferential edge of a shape when seen in a plan view in a state before being pinched between the heat generating element (35) and the cooler (88), wherein the convex sections (104) and the concave sections (103) may be disposed to be arranged alternately in a circumferential direction of a shape when seen in a plan view.

According to the aspect of (6), the heat conduction sheet is formed in a substantially star-shaped polygonal shape (pointed star shape) when seen in a plan view. When the heat conduction sheet is disposed and pinched between the heat generating element and the cooler, the heat conduction sheet is deformed to radially expand from the central position in a shape when seen in a plan view. In particular, in the concave section of the outer circumferential edge, the heat conduction sheet is deformed to greatly expand toward the outer circumferential side in a shape when seen in a plan view. For this reason, in a state in which the heat generating element and the cooler are assembled to compress the heat conduction sheet, the concave section of the outer circumferential edge of the heat conduction sheet is changed into a linear shape, and the heat conduction sheet is changed into a substantially polygonal shape. According to the shape change, the heat conduction sheet can be easily disposed according to the disposition shape.

(7) A method of manufacturing an electric parts assembly (35K) according to an aspect of the present invention is a method of manufacturing an electric parts assembly including a cooler (88); a heat generating element (35) disposed on a mounting surface (88A) of the cooler (88); and a heat conduction sheet (101) disposed between a facing surface (35A) of the heat generating element (35) on the side of the cooler (88) and the mounting surface (88A) of the cooler (88), and assembled in a state in which the heat conduction sheet (101) is pinched between the heat generating element (35) and the cooler (88), the method including a first process of forming a plurality of separate sheets (102) separated when seen in a plan view of the heat conduction sheet (101) and forming concave sections (103) recessed circumferentially inward on an outer circumferential edge of the separate sheets (102) in a shape when seen in a plan view; a second process of disposing the plurality of separate sheets (102) on at least one of the mounting surface (88A) of the cooler (88) and the facing surface (35A) of the heat generating element (35) and disposing the concave sections (103) of the separate sheets (102) adjacent to each other; and a third process of pinching the plurality of separate sheets (102) between the heat generating element (35) and the cooler (88) and changing a shape of an outer circumferential edge of the plurality of separate sheets (102) to fill the neighboring concave sections (103).

According to the aspect of (7), when the plurality of separate sheets having the concave sections are arranged on the outer circumferential edge in a shape when seen in a plan view such that the concave sections are adjacent to each other and disposed and pinched between the heat generating element and the cooler, the separate sheets are deformed to radially expand from the central position in a shape when seen in a plan view. In particular, in the concave section of the outer circumferential edge, the separate sheets are deformed to greatly expand toward the outer circumferential side in a shape when seen in a plan view. For this reason, in a state in which the heat generating element and the cooler are assembled to compress the separate sheets, the concave section of the outer circumferential edge is changed into a linear shape, and the separate sheets are changed into a substantially polygonal shape. An unintentional increase in sheet reaction force can be minimized by disposing the plurality of separate sheets in anticipation of this shape change. In addition, a gap between the neighboring separate sheets after sheet compression can be reduced (the compression area of the entire heat conduction sheet can be enlarged as much as possible) to increase heat radiation performance of the heat generating element.

According to the present invention, it is possible to provide a heat radiation structure of an electric parts assembly, a heat conduction sheet, and a method of manufacturing an electric parts assembly that are capable of reducing the gap between the neighboring separate sheets after sheet compression while minimizing an unintentional increase in sheet reaction force.

DETAILED DESCRIPTION OF THE INVENTION

Hereinafter, an embodiment of the present invention will be described with reference to the accompanying drawings.

Figure 1:
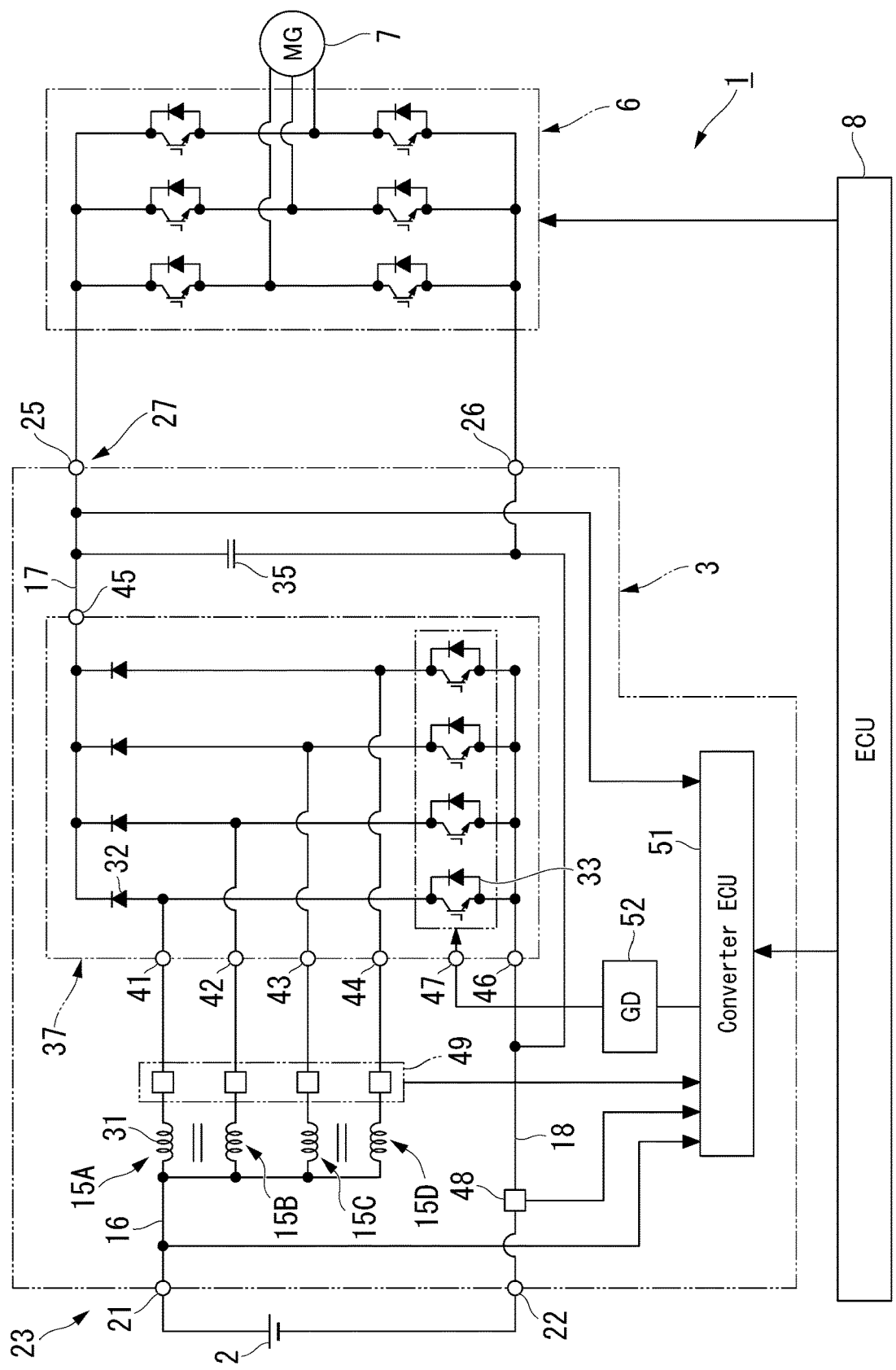
FIG. 1 is an electric circuit diagram of an electric automobile according to an embodiment.

As shown in FIG. 1, an electric automobile 1 according to the present invention includes a battery 2, a converter (an electric power conversion device) 3, a power drive unit (PDU) 6 and a motor generator 7. The converter 3 is a DC/DC converter, and the PDU 6 is an inverter. The converter 3 and the PDU 6 are controlled by an ECU 8.

Electric power of the battery 2 is supplied to the motor generator 7 via the converter 3 and the PDU 6. The motor generator 7 is a driving power source for traveling, is driven by receiving supply of electric power from the battery 2, and rotates wheels of the electric automobile 1. The motor generator 7 is operated as a generator upon deceleration of the electric automobile 1 and generates regenerative electric power while providing a braking force to the wheel. The regenerative electric power is supplied to (stored in) the battery 2 via the PDU 6 and the converter 3.

The converter 3 is a multi-phase converter in which a plurality of voltage conversion parts 15A to 15D are connected in parallel. The converter 3 includes a primary side positive electrode line 16, a secondary side positive electrode line 17, first to fourth voltage conversion parts 15A to 15D, and a negative electrode line 18. The first to fourth voltage conversion parts 15A to 15D are connected in parallel between the primary side positive electrode line 16 and the secondary side positive electrode line 17.

A primary side positive terminal 21 is provided on one end of the primary side positive electrode line 16, and a primary side negative terminal 22 is provided on one end of the negative electrode line 18. The primary side positive terminal 21 and the primary side negative terminal 22 form a primary side connecting section 23 of the converter 3 and are connected to a positive electrode and a negative electrode of the battery 2. A secondary side positive terminal 25 is provided on one end of the secondary side positive electrode line 17, and a secondary side negative terminal 26 is provided on the other end of the negative electrode line 18. The secondary side positive terminal 25 and the secondary side negative terminal 26 form a secondary side connecting section 27 of the converter 3 and are connected to the PDU 6.

The first to fourth voltage conversion parts 15A to 15D include reactors 31 and diodes 32, include switching elements 33 configured to connect a portion of an electric power line between the reactors 31 and the diodes 32 to the negative electrode line 18, and constitute a boosting chopper circuit. The reactors 31 and the diodes 32 are provided in series in sequence from the side of the primary side positive electrode line 16 on the electric power line configured to connect the primary side positive electrode line 16 and the secondary side positive electrode line 17. A secondary side capacitor 35 for smoothing is connected between the secondary side positive electrode line 17 and the negative electrode line 18.

All of the diodes 32 and the switching elements 33 included in the first to fourth voltage conversion parts 15A to 15D are integrated as one power module (a semiconductor module, a switching part) 37. The power module 37 includes a board configured to support the diodes 32 and the switching elements 33, and a mold resin that covers the diodes 32 and the switching elements 33 and forms an external form of the power module 37.

The power module 37 includes a first positive terminal 41, a second positive terminal 42, a third positive terminal 43, a fourth positive terminal 44, a fifth positive terminal 45, a negative terminal 46 and a driving signal terminal 47. The first positive terminal 41 is a primary side terminal of a positive electrode corresponding to the first voltage conversion part 15A. The second positive terminal 42 is a primary side terminal of the positive electrode corresponding to the second voltage conversion part 15B. The third positive terminal 43 is a primary side terminal of the positive electrode corresponding to the third voltage conversion part 15C. The fourth positive terminal 44 is a primary side terminal of the positive electrode corresponding to the fourth voltage conversion part 15D. The fifth positive terminal 45 is a secondary side terminal of the positive electrode. The negative terminal 46 is connected to the negative electrode line 18. The driving signal terminal 47 has a plurality of contacts corresponding to the switching elements 33, to which driving signals to the switching elements 33 are input.

A first current sensor 48 is provided on the negative electrode line 18, and a second current sensor 49 configured to detect current that flows for each phase is provided on an electric power line of a voltage conversion part 15 of each phase. The first current sensor 48 and the second current sensor 49 are Hall type current sensors that do not have electrical contacts with a circuit that is a detecting target.

The converter 3 is a converter ECU 51 (a control device) configured to control turning on/off the switching elements 33 by receiving signals from the ECU 8. The converter ECU 51 outputs control signals to the switching elements 33 via a gate driver 52. The gate driver 52 outputs driving signals corresponding to the control signals output from the converter ECU 51 to the switching elements 33 and drives the switching elements 33.

Each of the voltage conversion parts 15 boosts a voltage through on/off of the switching elements 33 according to the signals of the converter ECU 51 and supplies the boosted voltage to a secondary side. The converter ECU 51 determines the number of the electric power conversion parts that are driven, and a phase and a duty ratio of on/off of each of the switching elements 33 according to the signal from the ECU 8 and the signals from the first current sensor 48 and the second current sensor 49.

Next, a structure of the converter 3 will be described.

Figure 2:
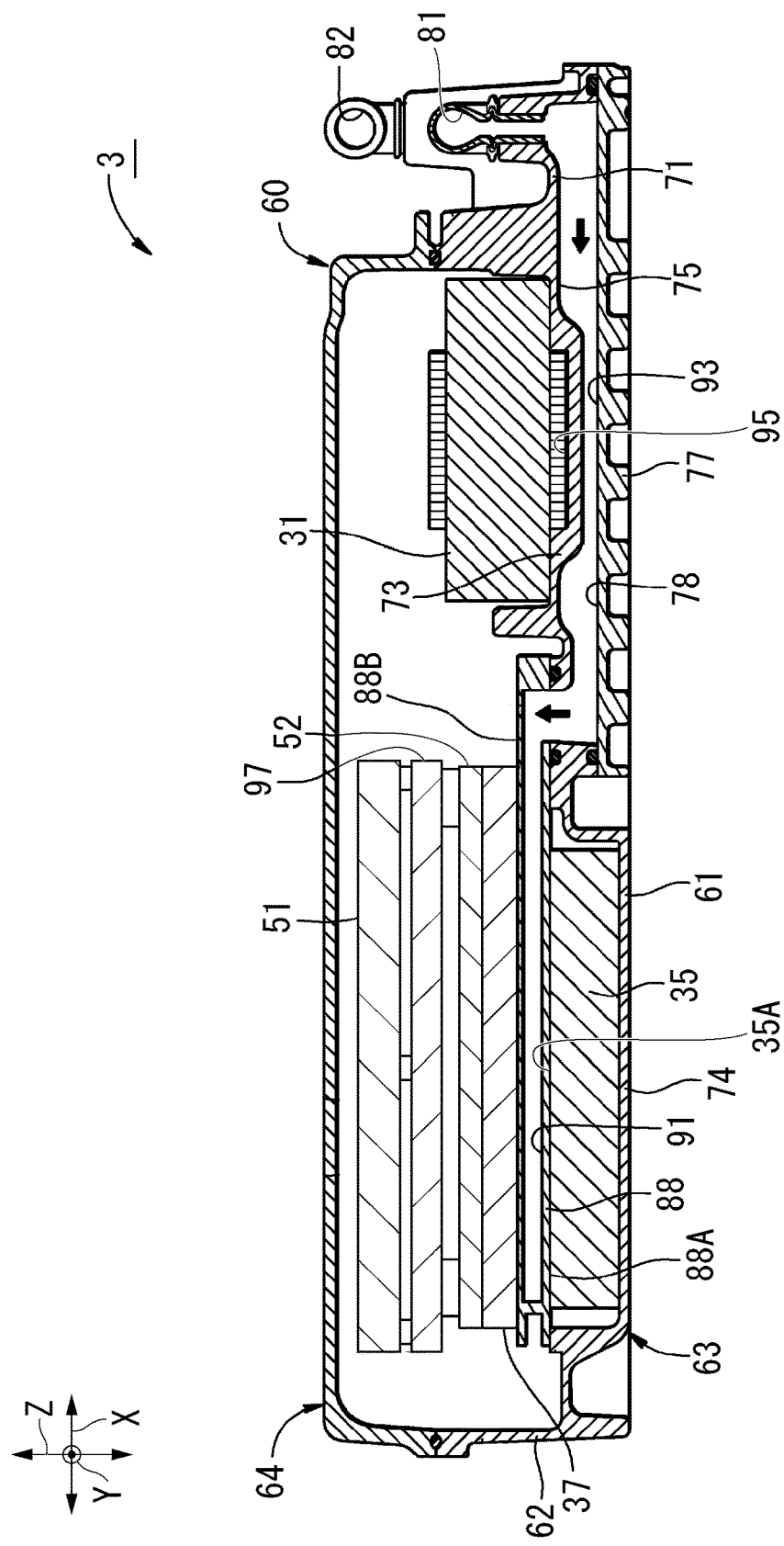
FIG. 2 is a cross-sectional view showing a schematic structure of a converter of the electric automobile.

As shown in FIG. 2, an outer shell of the converter 3 is constituted by a case 60. The case 60 is formed of a metal material such as aluminum or the like. The case 60 is formed in a flat shape in which a thickness in an upward/downward direction in the drawing is minimized Hereinafter, the upward/downward direction (a thickness direction, for example, the upward/downward direction upon mounting on a vehicle) in the drawing is referred to as a Z direction, a first direction perpendicular to the Z direction (for example, a leftward/rightward direction upon mounting on the vehicle) is referred to as an X direction, and a second direction perpendicular to the Z direction and the X direction (for example, a forward/rearward direction upon mounting on the vehicle) is referred to as a Y direction.

The case 60 includes a first case 63 and a second case 64 formed in box shapes and having opening ends that abut each other. The case 60 forms a storage space between the first case 63 and the second case 64. One of the first case 63 and the second case 64 (in the embodiment, the first case 63 on the lower side in the drawing) includes a bottom section 61 (a first member, a mounting section) having a flat plate shape, and a sidewall section 62 standing upward from an outer circumferential section of the bottom section 61 in the drawing.

The bottom section 61 has a flat plate shape in a plane including the X direction and the Y direction and is formed in a rectangular shape in which a width in the X direction is greater than a width in the Y direction. Hereinafter, a region of the bottom section 61 on the right side in the drawing is referred to as a first region 73, and a region of the bottom section 61 on the left side in the drawing is referred to as a second region 74. An extension section 71 overhanging further outward in the X direction than the sidewall section 62 on the right side in the drawing is provided in the first region 73.

A concave section 75 displaced upward in the drawing is formed in the first region 73 of the bottom section 61. A cover 77 parallel to the bottom section 61 is attached to the concave section 75 on the lower side in the drawing. The cover 77 cooperates with the concave section 75 to form a first flow path 78. The first flow path 78 extends in the X direction. The first flow path 78 is partitioned on an upstream side and a downstream side in the Y direction. A coolant introduction section 81 and a coolant discharge section 82 are connected to each of the upstream side and the downstream side of the first flow path 78. The coolant introduction section 81 and the coolant discharge section 82 are provided on the extension section 71 of the bottom section 61.

A support plate 88 is disposed in the second region 74 on the upper side in the drawing with an interval. The support plate 88 is formed in a plate shape having a first surface (a mounting surface) 88A directed toward the bottom section 61 (a lower side in the drawing), and a second surface (a second mounting surface) 88B directed to a side opposite to the bottom section 61 (an upper side in the drawing). The secondary side capacitor 35 is disposed on the side of the first surface 88A of the support plate 88, and the power module 37 is disposed on the side of the second surface 88B of the support plate 88.

A second flow path 91 is formed in the support plate 88. The second flow path 91 is offset upward with respect to the first flow path 78 in the drawing. The second flow path 91 extends in the X direction. The second flow path 91 is partitioned on the upstream side and the downstream side in the Y direction. The second flow path 91 allows communication between the upstream side and the downstream side at an end portion of the support plate 88 on the left side of the drawing. The second flow path 91 is formed such that the upstream side and the downstream side are folded at the end portion on the left side of the drawing. In the second flow path 91, end portions of the upstream side and the downstream side on the right side of the drawing are in communication with end portions of the upstream side and the downstream side of the first flow path 78 on the left side of the drawing, respectively.

The first flow path 78 and the second flow path 91 form a series of medium flow paths 93 through which a cooling medium flows. The cooling medium is, for example, water. The coolant introduction section 81 and the coolant discharge section 82 are connected to a circulation circuit (not shown) for a cooling medium via a hose or the like. The coolant introduction section 81 receives supply of the cooling medium from the circulation circuit. The coolant discharge section 82 returns the cooling medium to the circulation circuit. The cooling medium flows to pass through the coolant introduction section 81, the upstream side of the first flow path 78, the second flow path 91, the downstream side of the first flow path 78, and the coolant discharge section 82 in sequence.

As shown in FIG. 1, the plurality of reactors 31 corresponding to the first to fourth voltage conversion parts 15A to 15D are disposed on an upper surface of the first region 73 in the drawing. The plurality of reactors 31 are disposed to be arranged in the Y direction. The reactors 31 are disposed such that axes thereof extend in the X direction. For example, the neighboring reactors 31 in the Y direction share an annular iron core.

The reactors 31 come into contact with the upper surface of the first region 73 in the drawing. Concave storing sections 95 into which winding sections of the reactors 31 are fitted are formed in the upper surface of the first region 73 of the drawing. Since parts of the reactors 31 are fitted into the concave storing sections 95, contact areas between the reactors 31 and the bottom section 61 are increased, and heat transfer between the reactors 31 and the bottom section 61 is promoted.

Figure 3:
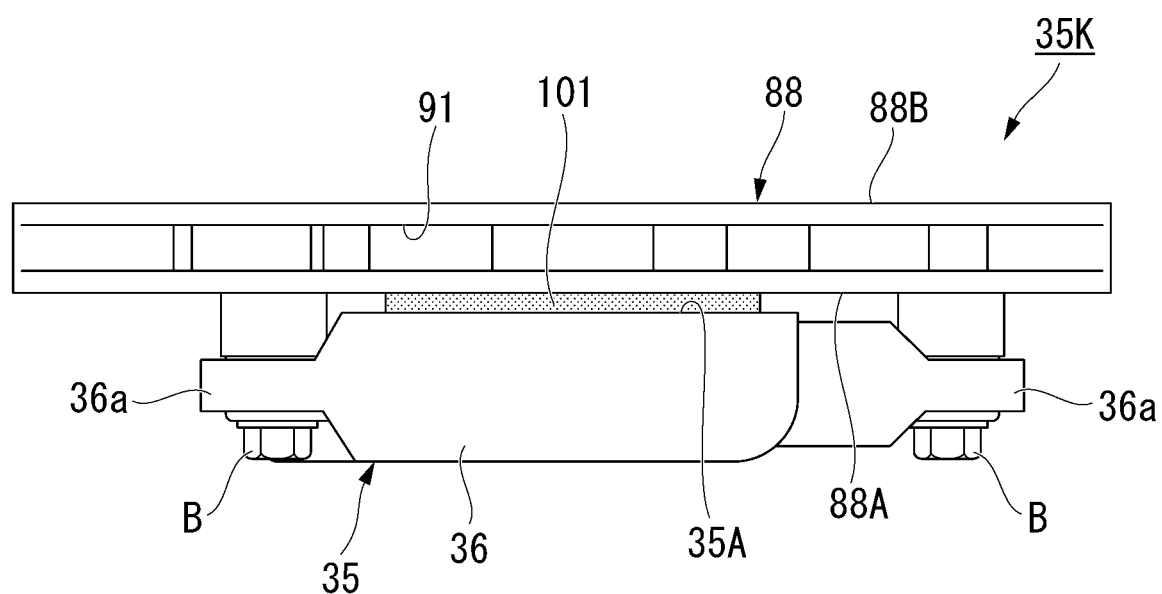
FIG. 3 is a side view of an assembly of a capacitor and a cooler of the converter.

As shown in FIG. 2 and FIG. 3, the secondary side capacitor 35 disposed on the first surface 88A of the support plate 88 has a flat plate shape parallel to the support plate 88. The upper surface of the secondary side capacitor 35 in the drawing comes in contact with the first surface 88A of the support plate 88 via a highly heat conductive sheet (hereinafter, simply referred to as a heat conduction sheet 101) 101. An integrated capacitor assembly (an electric parts assembly) 35K is configured by including the support plate 88, the secondary side capacitor 35 and the heat conduction sheet 101.

Hereinafter, the upper surface of the secondary side capacitor 35 in the drawing is referred to as a facing surface 35A with respect to the support plate 88. The secondary side capacitor 35 may be disposed such that a lower surface in the drawing opposite to the support plate 88 comes in contact with an upper surface of the second region 74 of the bottom section 61 in the drawing. That is, the secondary side capacitor 35 may be disposed between the first surface 88A of the support plate 88 and the upper surface of the second region 74 in the drawing, and come into contact with both of the support plate 88 and the second region 74 to increase heat radiation performance. In this case, the lower surface of the secondary side capacitor 35 of the drawing may come into contact with the upper surface of the bottom section 61 of the drawing via the heat conduction sheet 101.

The power module 37 disposed on the second surface 88B of the support plate 88 has an outer shell formed of a mold resin. The power module 37 has a flat shape in which a thickness in the upward/downward direction of the drawing is minimized. The gate driver 52 is fixed to the power module 37 on the side of the upper surface of the drawing. The gate driver 52 is a flat-plate-shaped electronic part constituted by a printed circuit board and elements, and configures a gate drive circuit. The gate driver 52 has a flat plate shape parallel to the power module 37. The power module 37 and the gate driver 52 that are coupled to each other configure an intelligent power module (IPM).

A support member 97 configured to support the converter ECU 51 is disposed on the gate driver 52 on the side of the upper surface of the drawing. The support member 97 is formed of an insulating resin material. The converter ECU 51 is a flat-plate-shaped electronic control device (ECU) constituted by a printed circuit board and elements. The converter ECU 51 has a flat-plate-shape parallel to the gate driver 52.

The secondary side capacitor 35, the support plate 88, the power module 37, the gate driver 52, the support member 97 and the converter ECU 51 are stacked on the second region 74 of the bottom section 61 in the Z direction on the side of the upper surface of the drawing, and configure, for example, an integrated unit.

Figure 4A:
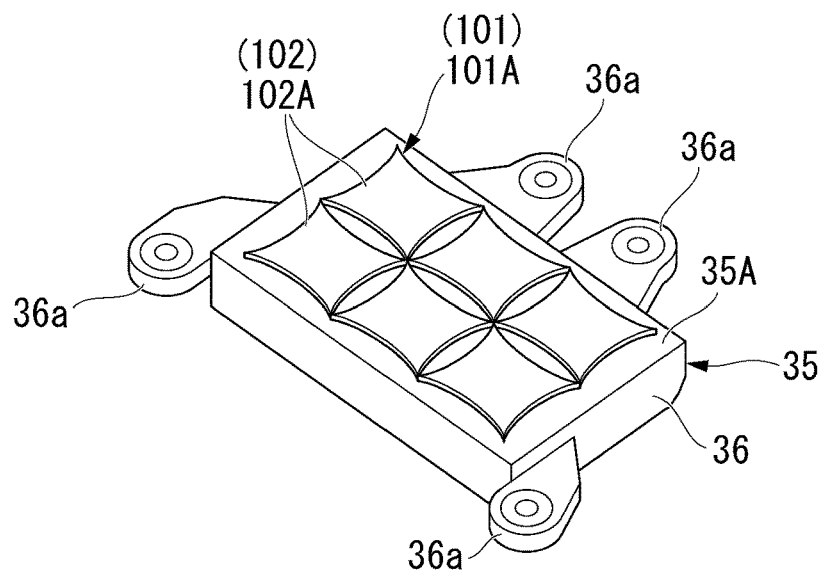
FIG. 4A is a perspective view of a state in which a heat conduction sheet is disposed on the capacitor according to the embodiment.
Figure 4B:
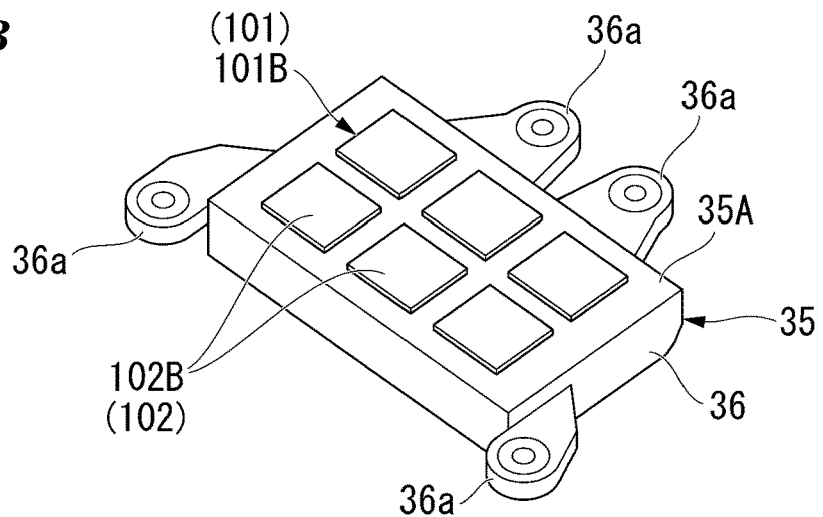
FIG. 4B is a perspective view of a state in which a heat conduction sheet is disposed on the capacitor according to a first comparative example.
Figure 4C:
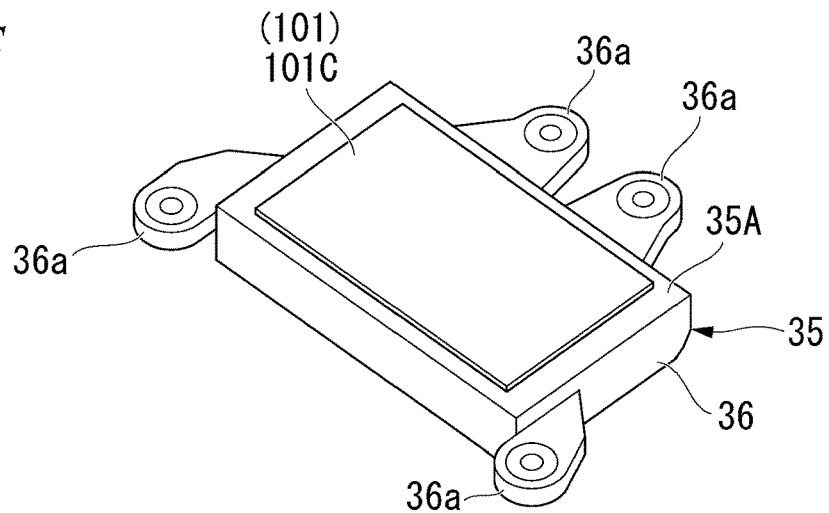
FIG. 4C is a perspective view of a state in which a heat conduction sheet is disposed on the capacitor according to a second comparative example.

As shown in FIG. 4A, FIG. 4B and FIG. 4C, the secondary side capacitor 35 includes a capacitor case 36 having a flat rectangular parallelepiped shape in which a thickness in the Z direction is minimized. The capacitor case 36 is formed of, for example, an insulating resin material. The capacitor case 36 is disposed on the first surface 88A of the support plate 88, and a fastening section 36a protruding on an outer circumferential side is fastened to the support plate 88 by a bolt B. The capacitor case 36 and the secondary side capacitor 35 may come into surface contact with the first surface 88A of the support plate 88. The secondary side capacitor 35 of the embodiment includes a plurality of capacitor main bodies 35b that are heat generating elements, which are arranged in a direction along a surface along the facing surface 35A. The plurality of (six) capacitor main bodies 35b are arranged in a grid pattern with three in the X direction and two in the Y direction.

The heat conduction sheet 101 is disposed between the facing surface 35A of the secondary side capacitor 35 and the first surface 88A of the support plate 88 to cross the entire surface of the facing surface 35A of the secondary side capacitor 35. The heat conduction sheet 101 is formed of, for example, acryl, silicon, or the like and has high heat transfer characteristics and flexibility. A heat radiation route of the heat generating module (the secondary side capacitor 35) with respect to the cooler (the support plate 88) is secured by the heat conduction sheet 101. For this reason, a capacitor with a low heat-resisting property also enables active cooling and makes it difficult to raise the temperature. Further, when the capacitor assembly 35K is assembled, since the heat conduction sheet 101 (separate sheets 102) is disposed in advance, the sheet may be disposed on either the first surface 88A of the support plate 88 or the facing surface 35A of the secondary side capacitor 35 and may be distributed to the first surface 88A and the facing surface 35A.

While a gap based on a component tolerance is necessary between the secondary side capacitor 35 and the support plate 88, since heat conductivity of air is low, an inclusion configured to fill the gap is necessary. Here, since the heat radiation sheet (the heat conduction sheet 101) having soft shape followability is used as an inclusion, heat radiation (cooling) performance of the secondary side capacitor 35 is secured with substantially no gap.

Figure 5:
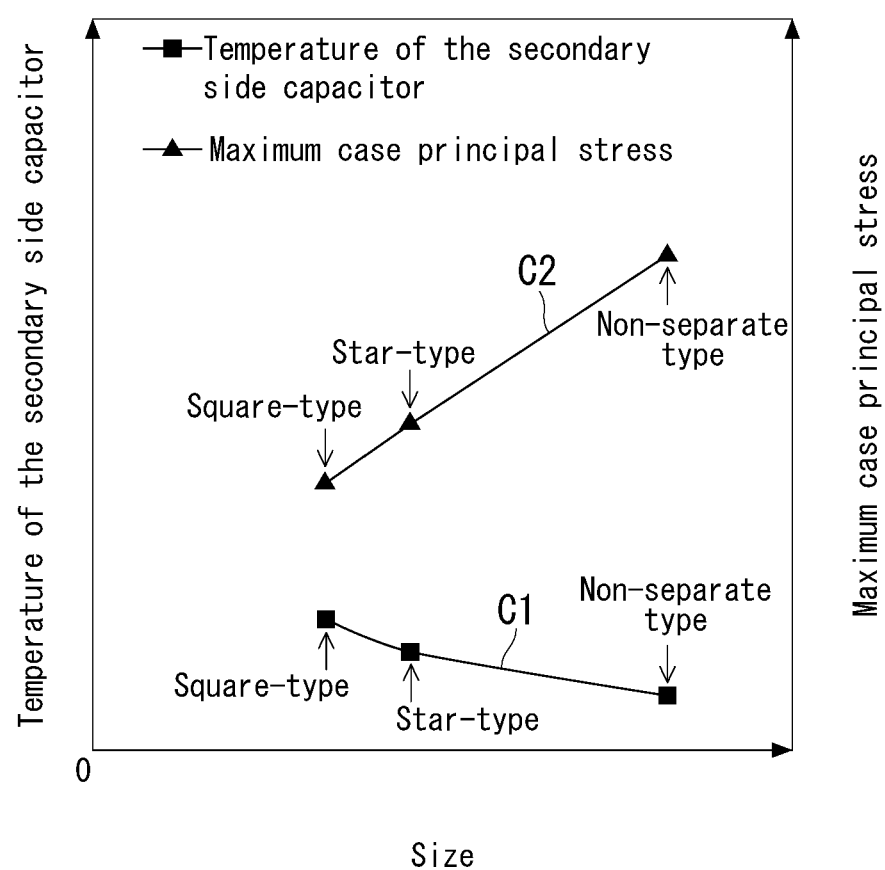
FIG. 5 is a graph in which a vertical axis shows a temperature of the capacitor in use and stress of a capacitor case upon sheet compression, and a horizontal axis shows an area of the heat conduction sheet upon compression.

As shown by a graph of FIG. 5, in actively cooling the secondary side capacitor 35 using the heat conduction sheet 101, the following relationship exists between the size, the heat radiation performance and the sheet reaction force of the heat conduction sheet 101 after compression.

That is, when the size (a compression area, a TP area in the drawing) of the heat conduction sheet 101 is increased, the heat radiation performance of the secondary side capacitor 35 is increased. In other words, when the size of the heat conduction sheet 101 is increased, the temperature of the secondary side capacitor 35 upon use of the converter 3 is minimized (see line C1 in the drawing). The temperature of the secondary side capacitor 35 upon use of the converter 3 is shown on a vertical axis on the left side of the drawing.

The size of the heat conduction sheet 101 after compression is increased in sequence of a square type, a star type, and a non-separate type. The non-separate type is a large-sized sheet provided to cross the entire surface of the secondary side capacitor 35 to cover all of the capacitor main bodies 35b (corresponding to the heat conduction sheet 101C of FIG. 4C). While the square type corresponds to a heat conduction sheet 101B of FIG. 4B and the star type corresponds to a heat conduction sheet 101A of FIG. 4A, detailed description thereof will be described below.

When the size of the heat conduction sheet 101 is increased, the sheet reaction force is also increased (see line C2 in the drawing). Maximum case principal stress corresponding to the sheet reaction force is shown on a vertical axis on the right side in the drawing. When the sheet reaction force is increased, the heat conduction sheet 101 may not be crushed to the required dimension. That is, before the heat conduction sheet 101 is crushed to the required dimension, the fastening section 36a or the like of the capacitor case 36 may be damaged. This is of particular concern when the heat conduction sheet 101 is not separated.

Figure 7A:
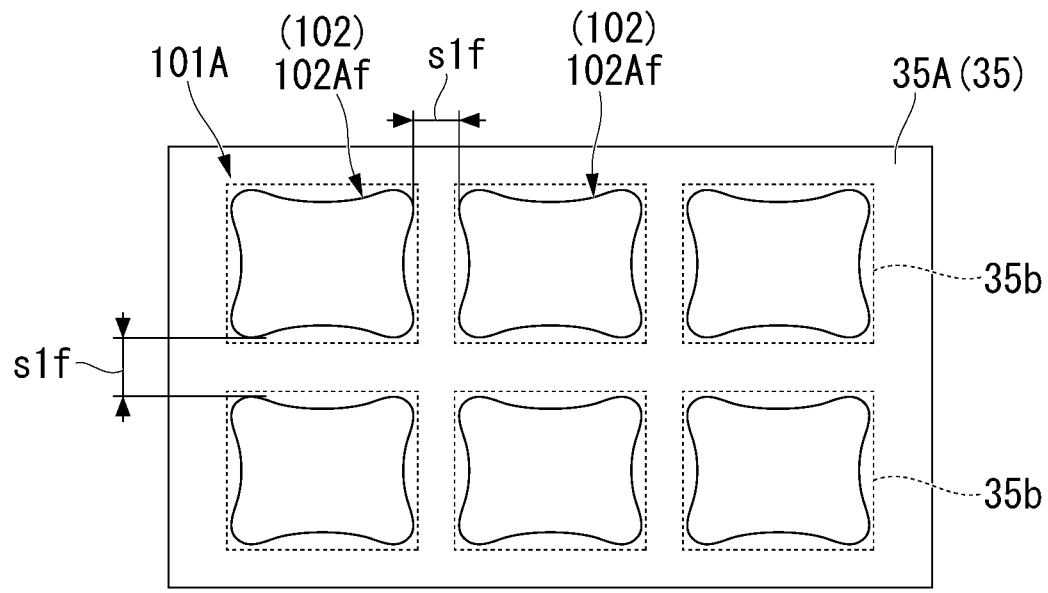
FIG. 7A is a plan view showing a state before compression in an arranged state of the separate sheets of the embodiment.
Figure 7B:
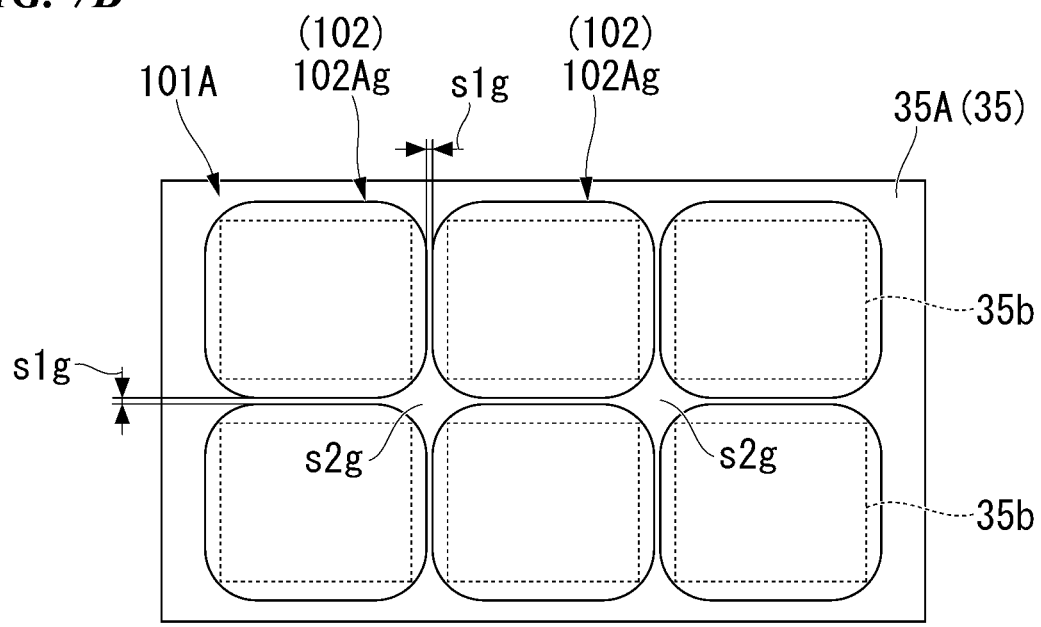
FIG. 7B is a plan view showing a state after compression in the arranged state of the separate sheets of the embodiment.

As shown in FIG. 7A and FIG. 7B, in the embodiment, in order to minimize the sheet reaction force when the heat conduction sheet 101 is compressed, the heat conduction sheet 101 is separated into six separate sheets 102 in directions along the facing surface 35A and the first surface 88A. The plurality of separate sheets 102 are disposed at a prescribed gap s1f before sheet compression (shown by reference sign 102f in FIG. 7A). The plurality of separate sheets 102 is a setting in which a gap s1g remains between the sheets even after sheet compression (shown by reference sign 102g in FIG. 7B), and a gap s2g also occurs around a sheet corner. For this reason, a compression area of the entire the heat conduction sheet 101 becomes smaller by the gaps s1g and s2g.

In addition, since the plurality of separate sheets 102 are disposed with the gap s1f therebetween, an extent in a surface direction of the separate sheets 102 is also allowed inside a sheet disposition region even upon sheet compression. For this reason, since the plurality of separate sheets 102 are used, in comparison with the case in which the non-separate sheets are used, the sheet reaction force upon compression is minimized according to a decrease in compression area.

The separate sheets 102 are set to have sizes and dispositions to overlap the capacitor main bodies 35b of the secondary side capacitor 35 when seen in a plan view. That is, the plurality of separate sheets 102 are arranged in a lattice pattern with three in the X direction and two in the Y direction. It is preferable that the plurality of separate sheets 102 have the same shape in consideration of manufacturability.

When the plurality of separate sheets 102 are disposed, if the gap s1f between the sheets is increased, the gap s1g more than expected remains between the sheets even after compression of the separate sheets 102. In this case, since a space region between the secondary side capacitor 35 and the support plate 88 (a region in which the heat conduction sheet 101 does not exist) is increased, the heat radiation performance of the secondary side capacitor 35 may be decreased. When the gap s1f between the sheets is reduced, interference between the adjacent sheets may occur upon sheet compression, and the sheet reaction force may increase more than expected.

As a result of diligent examination by the applicant of the application regarding variation of the separate sheets 102 before and after compression, the following knowledge was obtained.

Figure 6A:
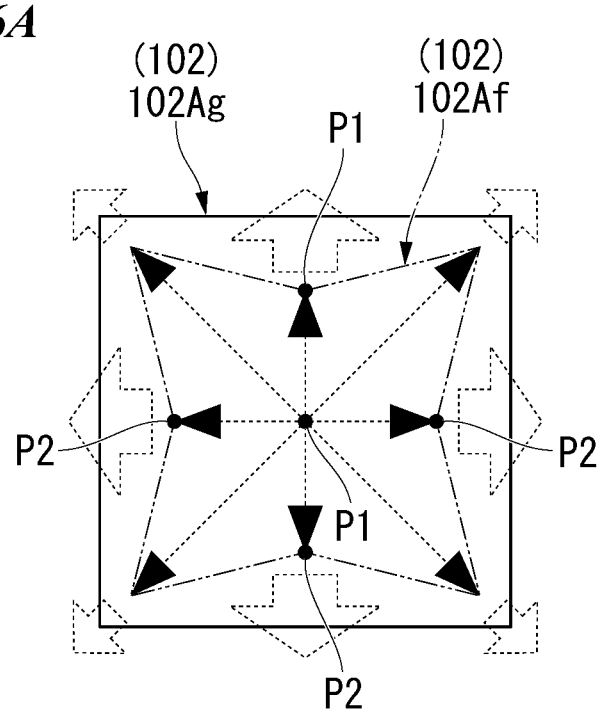
FIG. 6A is a plan view showing deformation of separate sheets of the heat conduction sheet according to the embodiment before and after compression.
Figure 6B:
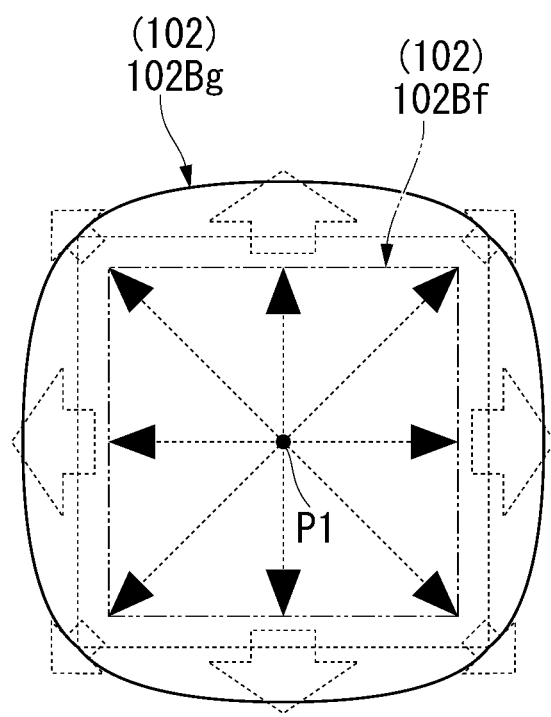
FIG. 6B is a plan view showing deformation of separate sheets of the heat conduction sheet according to a comparative example before and after compression.

As shown in FIG. 4B and FIG. 6B, first, it is assumed that the plurality of separate sheets 102B simply formed in a rectangular shape are arranged in a grid pattern and sandwiched between the secondary side capacitor 35 and the support plate 88. After disposition of the separate sheets 102B, when the secondary side capacitor 35 and the support plate 88 are fastened and fixed to the fastening section 36a on the outer circumferential side, the separate sheets 102B are crushed (compressed) between the secondary side capacitor 35 and the support plate 88 in the thickness direction. The separate sheets 102Bg after compression are deformed with respect to the separate sheets 102Bf before compression to approach a circular shape from a rectangular shape when seen in a plan view.

In other words, the separate sheets 102B after compression is deformed to radially expand from a central position P1 in a shape (to form a curved shape that protrudes toward the outer circumferential side) when seen in a plan view. Here, in the separate sheets 102, the extent to the outer circumferential side after compression is larger as the distance from the central position P1 in the shape when seen in a plan view is shorter. With the rectangular separate sheets 102B, the extent to the outer circumferential side after compression is greater as it goes closer to a central position P2 in the lengthwise direction (the circumferential direction) of four sides.

In the rectangular separate sheets 102B, the four sides that are straight before compression are changed into convex curves on the outer circumferential side after compression. In this case, when the gap s1f between the separate sheets 102B before compression is small, after compression, the curved sides of the neighboring separate sheets 102B interfere with each other, and the sheet reaction force increases more than expected.

When the gap s1f between the separate sheets 102B before compression is simply increased such that the neighboring separate sheets 102B do not interfere with each other, a large space region (a region in which the heat conduction sheet 101 does not exist) remains between the neighboring separate sheets 102B even after compression, and the heat radiation performance of the secondary side capacitor 35 may be decreased.

As shown in FIG. 4A and FIG. 6A, each of the separate sheets 102A of the embodiment has concave sections 103 obtained by bending (or folding) portions corresponding to the four sides of the rectangular shape to be recessed toward the sheet inner circumferential side rather than simply forming a rectangular shape when seen in a plan view. In other words, each of the separate sheets 102A of the embodiment has a substantially star-shaped rectangular shape (a four-pointed star shape) when seen in a plan view. Accordingly, interference between the neighboring separate sheets 102A upon sheet compression is minimized by setting of the concave sections 103, and an unintentional increase in sheet reaction force is minimized. In the embodiment, the above-mentioned star-shaped separate sheets 102A is referred to as a star type, and the separate sheets 102B as the comparative example shown in FIG. 4B and FIG. 6B is referred to as a square type.

Returning to a graph of FIG. 5, a size of the star type separate sheets 102A of the embodiment after compression is greater than that of the square type separate sheets 102B of the comparative example, and it can be said that the heat radiation performance of the secondary side capacitor 35 is increased. While the sheet reaction force is greater as a size of the star type separate sheets 102A of the embodiment after compression is greater than that of the square type separate sheets 102B of the comparative example (see line C2 of the drawing), the sheet reaction force is significantly smaller than that of the non-separate sheets, and the separate sheets 102A can be compressed sufficiently.

Figure 8:
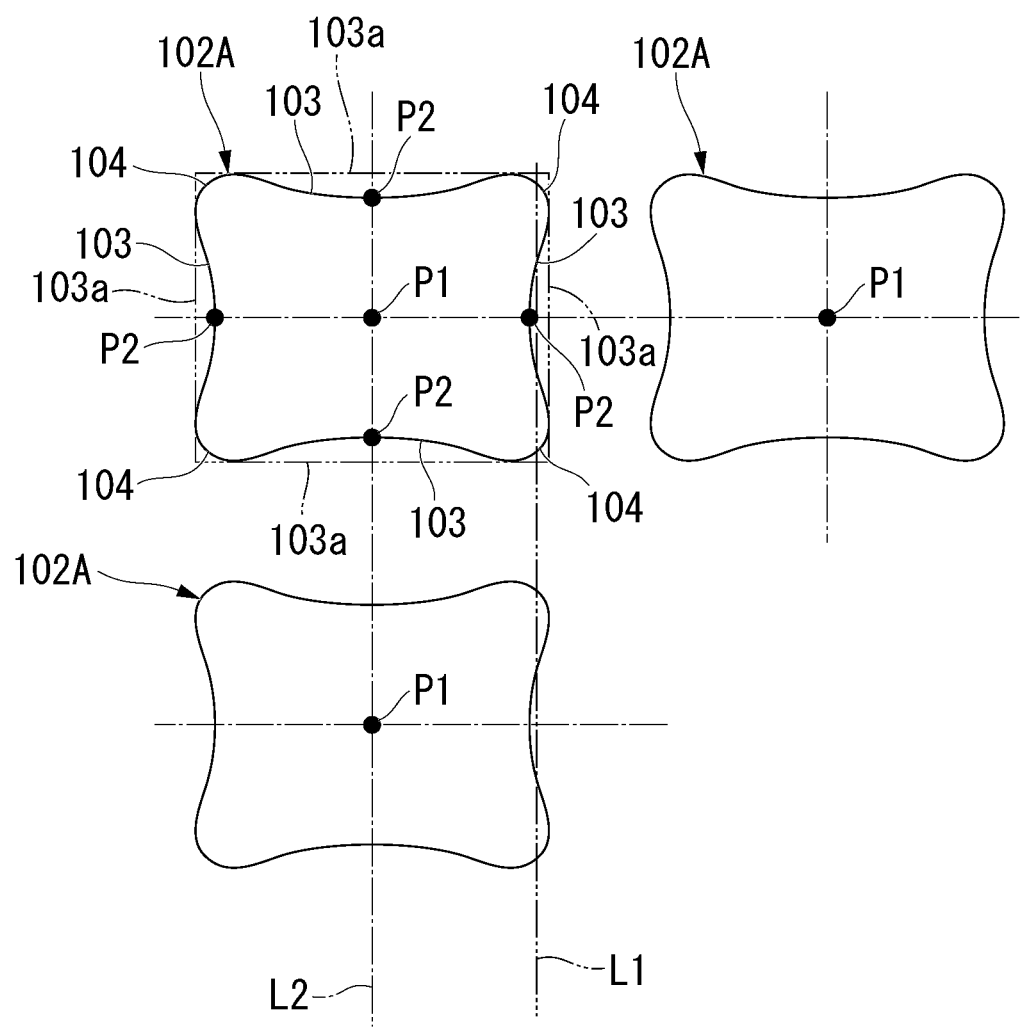
FIG. 8 is a plan view of the separate sheets of the embodiment.

As shown in FIG. 8, in the separate sheets 102A before compression, when the portions corresponding to the four corners in a shape when seen in a plan view are convex sections 104 protruding toward the outer circumferential side of the sheet, the convex sections 104 and the concave sections 103 are disposed to be alternately arranged in the circumferential direction on the outer circumferential edge of the separate sheets 102A before compression in a shape when seen in a plan view.

In the separate sheets 102A, virtual lines (straight lines) 103a are drawn to close the sheet outer circumferential side of the concave section 103 when seen in a plan view, and a rectangular shape when seen in a plan view is formed when the four virtual lines 103a corresponding to the concave section 103 are connected to each other. The virtual lines 103a correspond to tangential lines crossing the pair of neighboring convex sections 104 in the sheet circumferential direction and are straight lines that are parallel to or coincide with a straight line L1, which will be described below.

In the separate sheets 102A before compression, the degree of curvature of the four concave sections 103 is, for example, as follows.

That is, for example, in the separate sheets 102 in which a ratio between the longitudinal dimension and the lateral dimension in a shape when seen in a plan view is about 4:5, a depth of each of the concave sections 103 on both sides in the longitudinal direction is 5 to 10% of the longitudinal dimension. The depth of each of the concave sections 103 on both sides in the longitudinal direction is 5 to 10% of the lateral dimension.

The line L1 in the drawing is a straight line passing through the neighboring convex sections 104 vertically in the drawing, and the line L2 is a straight line passing through the central position P1 of the sheet and parallel to the straight line L1. In the concave section 103 between the convex sections 104 through which the straight line L1 passes, a distance to the straight line L2 is reduced as it approaches the central position P2 in the lengthwise direction (the circumferential direction of the sheet). That is, in the concave section 103, the central position P2 in the lengthwise direction is the deepest section.

As shown in FIG. 7A and FIG. 7B, the separate sheets 102A having the above-mentioned shape sets an initial shape (a shape before compression) to have a desired rectangular shape after fastening of the secondary side capacitor 35 (after sheet compression).

As shown in FIG. 7A, since the separate sheets 102A before sheet compression has the four-pointed star shape, the shape when crushed by compression is approximated to a desired rectangular shape.

As shown in FIG. 7B, the gap s1g between the separate sheets 102A after sheet compression is set to, for example, slightly less than 1 mm such that the sheets do not interfere with each other even when the mold tolerance or the like is included.

Further, the corners of the separate sheets 102A of the shape when seen in a plan view may be pointed corners without roundness in order to minimize occurrence of the gap s2g between the neighboring corners. However, because of the sheet cutting mold, the corner is chamfered in an arc shape. For this reason, the space region (the gap s2g) obtained by chamfering the corners, in which the heat conduction sheet 101 do not exist, is provided around the corners of the separate sheets 102A of the shape when seen in a plan view.

In the embodiment, the separate sheets 102 having a necessary minimum area and overlapping the capacitor main bodies 35*b* when seen in a plan view is disposed immediately above the plurality of capacitor main bodies 35*b* required for cooling in the secondary side capacitor 35. Accordingly, the heat radiation performance of each of the capacitor main bodies 35*b* is secured via each of the separate sheets 102.

Then, since the separate sheets 102 is the star type, when the separate sheets 102 are crushed, the neighboring separate sheets 102 are set not to interfere with each other, and the gap s1g between the separate sheets 102 when seen in a plan view is set to be narrowed.

Accordingly, an increase in sheet reaction force is minimized due to interference between the neighboring separate sheets 102, and high heat radiation performance can be realized by securing the sheet compression area as much as possible. That is, a compression load (a sheet reaction force) of the heat conduction sheet 101 can be reduced while holding heat feasibility of the heat conduction sheet 101 (while holding a required heat radiation area).

As described above, the heat radiation structure of the electric parts assembly according to the embodiment is a heat radiation structure of the capacitor assembly 35K including the support plate 88 serving as a cooler, the secondary side capacitor 35 disposed on the first surface 88A of the support plate 88, and the heat conduction sheet 101 disposed between the facing surface 35A in the secondary side capacitor 35 on the side of the support plate 88 and the first surface 88A of the support plate 88, and assembled in a state in which the heat conduction sheet 101 is pinched between the secondary side capacitor 35 and the support plate 88. The heat conduction sheet 101 includes the plurality of separate sheets 102 that partially configure a shape when seen in a plan view. Each of the separate sheets 102 includes the plurality of convex sections 104 protruding toward the sheet outer circumferential side and the plurality of concave sections 103 recessed toward the sheet inner circumferential side, which are formed in the outer circumferential edge in a shape when seen in a plan view in a state before they are pinched between the secondary side capacitor 35 and the support plate 88. The convex sections 104 and the concave sections 103 are disposed to be alternately arranged in the circumferential direction of the shape of the separate sheets 102 when seen in a plan view.

According to this configuration, each of the plurality of separate sheets 102 is formed in a substantially star-shaped polygonal shape (pointed star shape) when seen in a plan view. The plurality of separate sheets 102 are disposed between the secondary side capacitor 35 and the support plate 88 such that the concave sections 103 are arranged to approach each other. In this state, when the secondary side capacitor 35 and the support plate 88 are pressure-welded to each other through fastening or the like, the plurality of separate sheets 102 are pinched and crushed on the secondary side capacitor 35 and the support plate 88. Here, the separate sheets 102 are deformed to radially expand from the central position P1 in a shape when seen in a plan view. In particular, the concave sections 103 of the outer circumferential edge are deformed to greatly expand toward the outer circumferential side in a shape when seen in a plan view. For this reason, in a state in which the secondary side capacitor 35 and the support plate 88 are assembled to compress the separate sheets 102, the concave sections 103 of the outer circumferential edge are changed into a linear shape, and the separate sheets 102 are changed to a substantially polygonal shape. The unintentional increase in sheet reaction force can be minimized by disposing the plurality of separate sheets 102 in anticipation of this shape change. In addition, the gap s1g between the neighboring separate sheets 102 after sheet compression can be reduced (the compression area of the entire heat conduction sheet 101 is widened as much as possible) to increase the heat radiation performance of the secondary side capacitor 35.

In the heat radiation structure of the electric parts assembly according to the embodiment, the secondary side capacitor 35 includes the plurality of capacitor main bodies 35*b* arranged in a direction along the surface along the facing surface 35A, and the plurality of separate sheets 102 are disposed to overlap the plurality of capacitor main bodies 35*b* when seen in a plan view.

According to this configuration, the separate sheets 102 can be disposed in the immediate vicinity of the capacitor main bodies 35*b*, and heat of the capacitor main bodies 35*b* is efficiently radiated to the support plate 88 via the separate sheets 102. Accordingly, the heat radiation performance of the capacitor main bodies 35*b* can be increased.

In the heat radiation structure of the electric parts assembly according to the embodiment, the capacitor main bodies 35*b* are capacitor elements, and the power module 37 including the semiconductor element is disposed on the second surface 88B of the support plate 88 opposite to the first surface 88A.

According to this configuration, since the semiconductor element is disposed on the support plate 88 at a side opposite to the capacitor element, heat radiation of the semiconductor element can also be performed by the support plate 88 while minimizing a thermal influence of the capacitor element with respect to the semiconductor element.

In the heat radiation structure of the electric parts assembly according to the embodiment, the concave sections 103 are formed to approach the central position P1 in a shape when seen in a plan view as they approach the central position P2 of the concave sections 103 in the circumferential direction.

According to this configuration, since the central position P2 of the concave sections 103 in the circumferential direction is closest to the central position P1 of the separate sheets 102 in a shape when seen in a plan view, it becomes easier to secure a deformation margin upon pinching of the separate sheets 102. That is, when the separate sheets 102 are deformed to radially expand from the central position P1 in a shape when seen in a plan view, it becomes easier to secure an extent margin to the sheet outer circumferential side of the concave sections 103. For this reason, the separate sheets 102 can be crushed sufficiently to bring the secondary side capacitor 35 and the support plate 88 into close contact with each other.

In the heat radiation structure of the electric parts assembly according to the embodiment, the outer circumferential edge of the separate sheets 102 in a shape when seen in a plan view is formed by alternately arranging the four convex sections 104 and the four concave sections 103. When the virtual lines 103a are drawn to close the sheet outer circumferential side of the concave sections 103 and the four virtual lines 103a corresponding to the four concave sections 103 are connected to each other, a rectangular shape is formed when seen in a plan view.

According to this configuration, when the separate sheets 102 are pinched between the secondary side capacitor 35 and the support plate 88 and deformed, the concave sections 103 of the outer circumferential edge are changed in a linear shape and the separate sheets 102 are changed into a substantially rectangular shape. Accordingly, when the separate sheets 102 are pinched and deformed, a state in which the plurality of separate sheets 102 are laid between the secondary side capacitor 35 and the support plate 88 can be easily formed.

The heat conduction sheet (the separate sheets 102) according to the embodiment is a heat conduction sheet disposed between the support plate 88 and the secondary side capacitor 35 serving as a cooler and pinched between the secondary side capacitor 35 and the support plate 88. The heat conduction sheet (the separate sheets 102) includes the plurality of convex sections 104 protruding toward the sheet outer circumferential side and the plurality of concave sections 103 recessed toward the sheet inner circumferential side on the outer circumferential edge in a shape when seen in a plan view in a state before the heat conduction sheet is pinched between the secondary side capacitor 35 and the support plate 88. The convex sections 104 and the concave sections 103 are disposed alternately in the circumferential direction in a shape when seen in a plan view.

According to this configuration, the heat conduction sheet (the separate sheets 102) is formed in a substantially star-shaped polygonal shape (pointed star shape) when seen in a plan view. When the heat conduction sheet is disposed between the secondary side capacitor 35 and the support plate 88 and pinched, the heat conduction sheet is deformed to radially expand from the central position in a shape when seen in a plan view. In particular, in the concave sections 103 of the outer circumferential edge, the heat conduction sheet is deformed to greatly expand toward the outer circumferential side in a shape when seen in a plan view. For this reason, in a state in which the secondary side capacitor 35 and the support plate 88 are assembled to compress the heat conduction sheet, the concave sections 103 of the outer circumferential edge of the heat conduction sheet are changed into a linear shape, and the heat conduction sheet is changed into a substantially polygonal shape. According to the shape change, the heat conduction sheet can be easily disposed according to the disposition shape.

The method of manufacturing the electric parts assembly according to the embodiment is a method of manufacturing the capacitor assembly 35K including the support plate 88 serving as a cooler, the secondary side capacitor 35 disposed on the first surface 88A of the support plate 88, and the heat conduction sheet 101 disposed between the facing surface 35A of the secondary side capacitor 35 on the side of the support plate 88 and the first surface 88A of the support plate 88, and attached in a state in which the heat conduction sheet 101 is pinched between the secondary side capacitor 35 and the support plate 88. The method of manufacturing the electric parts assembly includes a first process, a second process and a third process. In the first process, the concave sections 103 recessed toward the sheet inner circumferential side are formed in the outer circumferential edge of the separate sheets 102 in a shape when seen in a plan view while forming the plurality of separate sheets 102 that partially configure the shape of the heat conduction sheet 101 when seen in a plan view. In the second process, the plurality of separate sheets 102 are disposed on at least one of the first surface 88A of the support plate 88 and the facing surface 35A of the secondary side capacitor 35, and the concave sections 103 of the separate sheets 102 are disposed to be adjacent to each other. In the third process, the plurality of separate sheets 102 are pinched between the secondary side capacitor 35 and the support plate 88, and the neighboring concave sections 103 are changed into a linear shape.

According to this configuration, when the plurality of separate sheets 102 having the concave sections 103 are arranged on the outer circumferential edge in a shape when seen in a plan view such that the concave sections 103 are adjacent to each other and disposed between the secondary side capacitor 35 and the support plate 88 and pinched, the separate sheets are deformed to radially expand from the central position in a shape when seen in a plan view. In particular, in the concave sections 103 of the outer circumferential edge, the separate sheets are deformed to greatly expand toward the outer circumferential side in a shape when seen in a plan view. For this reason, in a state in which the secondary side capacitor 35 and the support plate 88 are assembled to compress the separate sheets 102, the concave sections 103 of the outer circumferential edge are changed into a linear shape, and the separate sheets 102 are changed into a substantially polygonal shape. The unintentional increase in sheet reaction force can be minimized by disposing the plurality of separate sheets 102 in anticipation of this shape change. In addition, the gap s1g between the neighboring separate sheets 102 after sheet compression can be reduced (a compression area of the entire heat conduction sheet 101 is widened as much as possible), and the heat radiation performance of the secondary side capacitor 35 can be increased.

Further, the present invention is not limited to the embodiment, and for example, the cooler may be an air-cooling type cooler having heat radiation fins, in addition to the water-cooling type support plate 88 having a cooling water path.

While preferred embodiments of the invention have been described and shown above, it should be understood that these are exemplary of the invention and are not to be conceivable as limiting. Additions, omissions, substitutions, and other modifications can be made without departing from the spirit or scope of the present invention. Accordingly, the invention is not to be conceivable as being limited by the foregoing description, and is only limited by the scope of the appended claims.

EXPLANATION OF REFERENCES

35 Secondary side capacitor (heat generating element)
35A Facing surface
35b Capacitor main body (heat generating element)
35K Capacitor assembly (electric parts assembly)
37 Power module (second heat generating element)
88 Support plate (cooler)
88A First surface (mounting surface)
101 Heat conduction sheet
102 Divided sheet (heat conduction sheet)
103 Concave section
103a Virtual line
104 Convex section
P1 Central position of shape when seen in plan view
P2 Central position of concave section

What is claimed is:

1. A heat radiation structure of an electric parts assembly, which is a heat radiation structure of an electric parts assembly (35K) comprising:
   a cooler (88);
   a heat generating element (35) disposed on a mounting surface (88A) of the cooler (88); and
   a heat conduction sheet (101) disposed between a facing surface (35A) of the heat generating element (35) on the side of the cooler (88) and a mounting surface (88A) of the cooler (88), and
   assembled in a state in which the heat conduction sheet (101) is pinched between the heat generating element (35) and the cooler (88),
   wherein the heat conduction sheet (101) comprises a plurality of separate sheets (102) separated when seen in a plan view,
   each of the separate sheets (102) comprises a plurality of convex sections (104) protruding circumferentially outward from the sheet and a plurality of concave sections (103) recessed circumferentially inward on an outer circumferential edge of a shape when seen in a plan view in a state before being pinched between the heat generating element (35) and the cooler (88), and
   the convex sections (104) and the concave sections (103) are disposed to be arranged alternately in a circumferential direction of the separate sheets (102) in a shape when seen in a plan view.

2. The heat radiation structure of the electric parts assembly according to claim 1, wherein the heat generating element (35) comprises a plurality of heat generating elements (35b) arranged in a direction along a surface along the facing surface (35A), and
   the plurality of separate sheets (102) are disposed to overlap the plurality of heat generating elements (35b) when seen in a plan view.

3. The heat radiation structure of the electric parts assembly according to claim 2, wherein the heat generating elements (35b) are capacitor elements, and a second heat generating element (37) including a semiconductor element is disposed on a second mounting surface (88B) of the cooler (88) opposite to the mounting surface (88A).

4. The heat radiation structure of the electric parts assembly according to claim 1, wherein the concave section (103) is formed to approach a central position (P1) in a shape when seen in a plan view as it approaches a central position (P2) of the concave section (103) in the circumferential direction.

5. The heat radiation structure of the electric parts assembly according to claim 1, wherein the outer circumferential edge of the separate sheets (102) in a shape when seen in a plan view is formed by arranging alternately the four convex sections (104) and the four concave sections (103), and
   when virtual lines (103a) are drawn to close a sheet outer circumferential side of the concave sections (103) and the four virtual lines (103a) corresponding to the four concave sections (103) are connected to each other, a rectangular shape when seen in a plan view is formed.

6. A heat conduction sheet (102) disposed between a cooler (88) and a heat generating element (35) and pinched between the heat generating element (35) and the cooler (88), comprising a plurality of convex sections (104) protruding circumferentially outward from the sheet and a plurality of concave sections (103) recessed circumferentially inward on an outer circumferential edge of a shape when seen in a plan view in a state before being pinched between the heat generating element (35) and the cooler (88),
   wherein the convex sections (104) and the concave sections (103) are disposed to be arranged alternately in a circumferential direction of a shape when seen in a plan view.

7. A method of manufacturing an electric parts assembly, which is a method of manufacturing an electric parts assembly (35K) comprising:
   a cooler (88);
   a heat generating element (35) disposed on a mounting surface (88A) of the cooler (88); and
   a heat conduction sheet (101) disposed between a facing surface (35A) of the heat generating element (35) on the side of the cooler (88) and the mounting surface (88A) of the cooler (88), and
   assembled in a state in which the heat conduction sheet (101) is pinched between the heat generating element (35) and the cooler (88),
   the method comprising:
   a first process of forming a plurality of separate sheets (102) separated when seen in a plan view of the heat conduction sheet (101) and forming concave sections (103) recessed circumferentially inward on an outer circumferential edge of the separate sheets (102) in a shape when seen in a plan view;
   a second process of disposing the plurality of separate sheets (102) on at least one of the mounting surface (88A) of the cooler (88) and the facing surface (35A) of the heat generating element (35) and disposing the concave sections (103) of the separate sheets (102) to be adjacent to each other; and
   a third process of pinching the plurality of separate sheets (102) between the heat generating element (35) and the cooler (88) and changing a shape of an outer circumferential edge of the plurality of separate sheets (102) to fill the neighboring concave sections (103).

* * * * *